United States Patent
Huang et al.

(10) Patent No.: US 6,878,260 B2
(45) Date of Patent: Apr. 12, 2005

(54) PROCESS FOR FORMING A HIGH-QUALITY INTERFACE BETWEEN A PLATED AND A NON-PLATED AREA

(75) Inventors: Che-Hung Huang, Jungli (TW); Steven Hsu, Taoyuan (TW)

(73) Assignee: High Tech Computer, Corp., Tao Yuan (TW)

( * ) Notice: Subject to any disclaimer, the term of this patent is extended or adjusted under 35 U.S.C. 154(b) by 151 days.

(21) Appl. No.: 10/458,856

(22) Filed: Jun. 9, 2003

(65) Prior Publication Data

US 2004/0202776 A1 Oct. 14, 2004

(30) Foreign Application Priority Data

Apr. 9, 2003 (TW) ........................................ 92108083 A

(51) Int. Cl.⁷ ............................ C25D 5/54; C25D 5/56; C25D 5/34; B05D 1/32; B05D 1/40
(52) U.S. Cl. ....................... 205/159; 205/164; 205/167; 205/169; 205/210; 205/221; 205/223; 205/118; 205/136; 427/259; 427/331
(58) Field of Search .................... 427/259, 331; 205/118, 136, 159, 164, 167, 169, 210, 221, 223

(56) References Cited

U.S. PATENT DOCUMENTS 5,830,376 A * 11/1998 Bohlke et al. ................. 216/65

* cited by examiner

*Primary Examiner*—Edna Wong
(74) *Attorney, Agent, or Firm*—J.C. Patents

(57) ABSTRACT

A process for forming an interface (106) between a plated and a non-plated area (102, 104) on the surface of a plastic component (100) is disclosed. First, an anti-plating layer (110) is formed over the surface of the plastic component. Thereafter, a low-power laser beam (10) is used to remove a portion of the anti-plating layer and to form an interface between the plated area and the non-plated area. A seeding layer (120) is formed on the plated area so that the plated area is electrically conductive. Finally, a metallic layer (130) is electrically plated over the seeding layer. The metallic layer connects with the anti-plating layer via the interface. The cost of producing the anti-plating layer is low. Moreover, since the laser etching operation is able to produce a high-quality interface boundary between the plated and the non-plated area, yield of the process is improved.

17 Claims, 2 Drawing Sheets

PROCESS FOR FORMING A HIGH-QUALITY INTERFACE BETWEEN A PLATED AND A NON-PLATED AREA

CROSS-REFERENCE TO RELATED APPLICATION

This application claims the priority benefit of Taiwan application serial no. 92108083, filed Apr. 9, 2003.

BACKGROUND OF THE INVENTION

1. Field of Invention

The present invention relates to a surface plating process. More particularly, the present invention relates to a process for forming an interface between a plated and a non-plated area.

2. Description of Related Art

Surface plating finds many applications in the manufacturing industry. Aside from providing the surface of a product with a metallic luster, the plated metallic layer also has the capacity to shield against electromagnetic interference (EMI). In general, plating can be categorized into electroplating and electroless plating. In the electroplating, a reduction-oxidation reaction is set up inside an electrolyte (a metallic salt solution) so that the metallic ions are reduced back to metal (for example, copper or nickel) and deposited on the surface of the plating material that also serves as a cathode. In the electroless plating, a reducing agent is applied to a surface with metallic ions so that the metallic ions are reduced to metal and deposited on the surface of a plating surface without the passage of an electric current. In other words, electroless plating can be considered as a chemical plating process. To plate the surface of a plastic product, an electroless plating process is performed to form a seeding layer over the surface so that a subsequent electroplating process can be applied to form a compact metallic layer.

In the conventional method of plating a metallic layer on the surface of a plastic product, a masking or an etching method is often used to define the plated region and the non-plated region. One method is to set up a mask over the non-plated regions before carrying out an electroplating operation. After the electroplating operation, the mask is removed. A second method is to perform an etching process so that the seeding layer over the non-plated region is removed. After performing an electroplating operation, any residual metallic layer over the non-plated region is removed. A third method is to perform a high-power laser etching process to remove the metallic layer over the non-plated region after an electroplating operation. A fourth method is to set up a mask over the plated region after an electroplating operation. Thereafter, an etching process is carried out to remove the metallic layer over the non-plated region before removing the mask layer.

All the aforementioned plating methods for forming a metallic layer over a plastic surface have some form of defect at the interface between a plated region and a non-plated region. In the first method, the cost of producing the mask is high and, consequently, leads to a high production cost. Moreover, the quality of the interface produced by the mask is typically poor. In the second method, not only is the cost of performing the etching process relatively high, but the etching process also roughens the surface of the non-plated region. Moreover, some residual etching solution may contaminate the surface of the plated region and hence lower the plating yield. In the third method, the energy produced by the high-power laser may damage the surface of the non-plated region or produce undesirable marking on the surface of the non-plated region. In the fourth method, the cost of producing the mask is high and the quality of the interface produced by the mask is typically poor just like the first method.

SUMMARY OF THE INVENTION

Accordingly, one object of the present invention is to provide a method of producing a high-quality interface between a plated area and a non-plated area in the process of forming a local plated region on the surface of a plastic component.

To achieve these and other advantages and in accordance with the purpose of the invention, as embodied and broadly described herein, the invention provides a process of forming a plated area on a plastic surface having a quality interface between the plated area and its adjacent non-plated area. First, an anti-plating layer is formed on localized area of the plastic component. Thereafter, a portion of the anti-plating layer is etched by performing a low-power laser etching process to form a high-quality interface between the plated area and the non-plated area.

This invention also provides a process for forming a plating layer over localized area of a plastic surface. First, an anti-plating layer is formed on localized area of the plastic surface. Thereafter, a surface profile treatment of the anti-plating layer is carried out and then an electroless plating process is performed to form a surface seeding layer over areas of the plastic surface other than the ones with an anti-plating layer thereon. An electroplating process is performed to form a surface metallic layer over the surface seeding layer. Ultimately, the non-plated area above the anti-plating area and the metal plated area form a high-quality interface.

According to one embodiment of this invention, the surface seeding layer is a chemically deposited layer of copper and the surface profile treatment of the anti-plating layer includes a low energy laser etching process. Furthermore, after the surface profile treatment, a solvent is applied to remove any residual anti-plating material on the treated surface so that the yield of a subsequent copper or nickel electroplating is increased. In addition, the anti-plating layer is formed over the plastic surface by printing or coating anti-plating material, for example. Since the anti-plating material evaporates at a high temperature, a laser beam is able to etch out on demand whatever surface profile in the anti-plating layer is desired.

Anti-plating material with the capacity to produce a high quality interface through etching is used in this invention to form an anti-plating layer. There is no need to remove the anti-plating layer after the etching operation. Furthermore, because the anti-plating layer is formed on the surface of the non-plated area, the edge of the anti-plating layer also forms an ideal interface with the surrounding copper plated or nickel plated layer. In other words, this invention is able to produce a localized electroplated layer with a high-quality interface boundary on a plastic surface without the need for any expensive mask.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
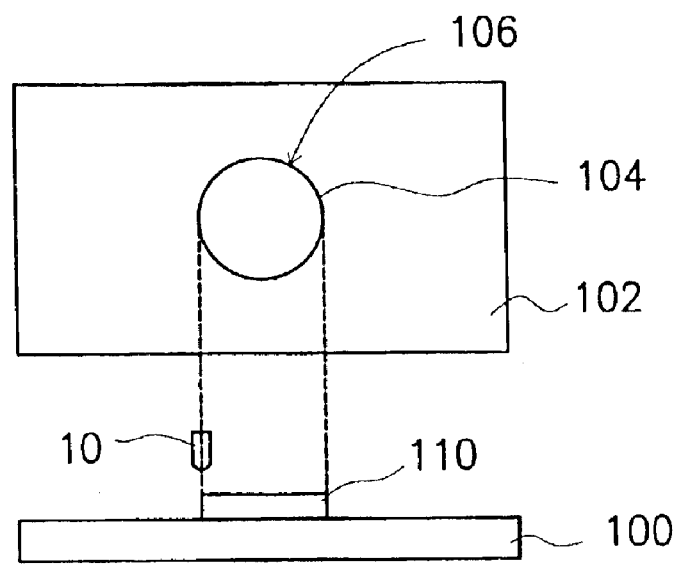
FIGS. 1A to 1C are diagrams showing a process of forming a localized plated area on a plastic surface with a high-quality interface between the plated area and an adjacent non-plated area.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
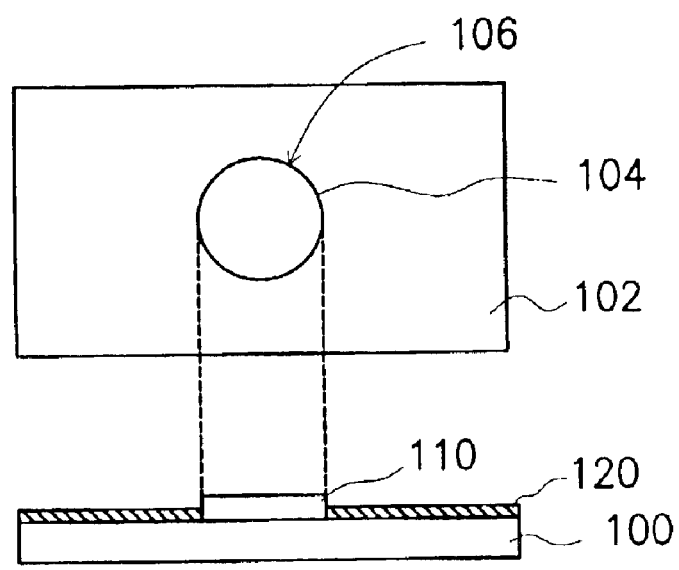
Figure 1C:
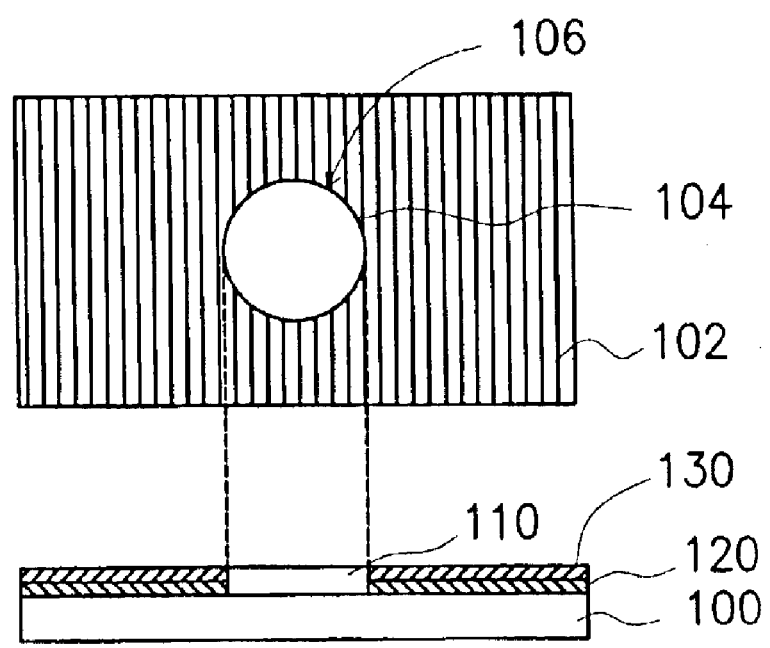

FIGS. 1A to 1C are diagrams showing a process of forming a localized plated area on a plastic surface with a high-quality interface between the plated area and an adjacent non-plated area. As shown in FIG. 1A, a non-plated area 104 (the circular area) needs to be formed within a plated area 102 of a plastic component 100. First, an anti-plating material is either coated or printed over the surface of the plastic component 100 to form an anti-plating layer 110 on the non-plated area 104. The anti-plating material is, for example, polycarbonate (PC) or acrylonitrile-butadiene-styrene (ABS) resin. Thereafter, a surface profile treatment using a low energy laser beam 10 (a low-power laser beam) is carried out around the boundary of the anti-plating layer 110 to form a high-quality interface 106 on the boundary of the non-plated area 104. Preferably, the laser beam 10 is an etching laser beam used to shape the boundary of the anti-plating layer 110. Since the laser beam 10 is able to vaporize the anti-plating material quickly, the unwanted anti-plating material bordering the non-plated area 104 can be removed to produce a smooth boundary. Moreover, dyestuff can be added to the anti-plating material to produce an anti-plating layer with a particular color or a hue close to the background color.

In addition, the aforementioned method of forming the anti-plating layer 110 has the cost of production advantage. Furthermore, some of the anti-plating material can be removed by vaporization using a low-energy laser beam instead of a high-energy laser beam. Thus, the plated area 102 of the plastic component 100 will receive minimal damage. Ideally, a solvent (not shown) is also applied to remove any residual anti-plating material after laser etching the anti-plating layer 110 so that the yield in a subsequent electroless or electroplating process for forming a plated copper or a nickel layer is increased.

To facilitate the deposition of metallic particles onto the plated layer of a plastic component, some pre-treatments (for example, degreasing, roughening, neutralizing, activating and accelerating processes) are carried out before the plating process as shown in FIG. 1B. During the pre-treatment processes, the anti-plating layer 110 is immune to any reaction so that the anti-plating properties are preserved. Thereafter, an electroless plating operation is carried out to form a seeding layer 120 over the plated area 102 of the plastic component 100.

As shown in FIG. 1C, an electroplating operation is carried out to form a metallic layer 130 over the plated area 102. Due to the presence of the anti-plating layer 110 over the non-plated area 104, no seeding material or metallic material is deposited over the non-plated area 104. Moreover, after the deposition of metallic material over the plated area 102, an interface 106 that clearly demarcates the boundary between the plated metallic layer 130 (shown in vertical lines) and the non-plated anti-plating layer 110 (shown as a circular disc) is formed. The metallic layer 130 is a plated copper layer or a plated nickel layer, for example. If the metallic layer 130 is a plated copper layer, an additional plated nickel layer or a plated tin layer is formed over the copper layer to prevent oxidation.

In addition to having a metallic luster, the aforementioned local plating operation also provides a shield to electromagnetic interference. Moreover, the plating method can be applied to many types of plastic casings including, for example, the casing of a mobile phone, the casing of a notebook computer or the casing of other electronic products regardless of size, material or design.

Although the plating of a single plastic surface is used as an illustration, the plating process can also be applied to double-sided plating, multi-sided plating or non-planar plating (for example, the side edges or the covers of a frame). In fact, the plating process of this invention can be applied to any plastic surface to produce a high-quality interface between a non-plated area and a plated area.

In conclusion, the process for forming an interface between a plated and a non-plated area over a plastic surface has at least the following advantages.

1. The cost of producing the anti-plating layer is low. Moreover, a low-energy laser beam can shape the boundary of the anti-plating layer with little damage to the surface of the plated area by evaporating a portion of the anti-plating material.
2. The etched anti-plating layer has a fine and delicate boundary profile. Hence, there is no need to remove the anti-plating layer from the non-plated area after plating operation.
3. The plating process can be applied to the casings of any size, material or design. Aside from single-sided plating of a plastic surface, double-sided, multi-sided or non-planar plating (such as the side edges or cover of a frame) can be applied to produce a variety of localized plating effects.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A process for forming an interface between a plated area and a non-plated area on the surface of a non-metallic component, at least comprising the steps of:

forming an anti-plating layer over a localized area on the surface of the non-metallic component;

etching the boundary of the anti-plating layer to produce an interface profile using a laser beam; and performing an electroplating process to form a plated layer over the remaining area of the plastic component wherein the plated layer is in contact with the anti-plating layer at an interface.

2. The process of claim 1, wherein the step of forming the anti-plating layer over the non-metallic component comprises performing a coating process to deposit a layer of anti-plating material.

3. The process of claim 1, wherein the step of forming an anti-plating layer over the non-metallic component comprises performing a printing process to deposit a layer of anti-plating material.

4. The process of claim 1, wherein the step of performing a laser etching comprises performing a low-power laser etching process.

5. A localized plating process for forming a plated layer over the surface of a plastic component, at least comprising the steps of:
    forming an anti-plating layer over a localized region of the plastic component;
    performing a boundary profile treatment of the anti-plating layer;
    forming a seeding layer on the remaining area of the plastic component; and
    forming a metallic layer over the seeding layer.

6. The process of claim 5, wherein the step of forming an anti-plating layer over the plastic component comprises performing a coating process to deposit a layer of anti-plating material.

7. The process of claim 5, wherein the step of forming an anti-plating layer over the plastic component comprises performing a printing process to deposit a layer of anti-plating material.

8. The process of claim 5, wherein the profile treatment comprises performing a laser etching.

9. The process of claim 8, wherein the step of performing a laser etching comprises performing a low-power laser etching process.

10. The process of claim 5, wherein the step of forming a seeding layer on the remaining area comprises performing an electroless plating process.

11. The process of claim 5, wherein the step of forming a metallic layer over the seeding layer comprises performing an electroplating process.

12. The process of claim 11, wherein the step of forming the metallic layer over the seeding layer comprises performing an electroplating process to form a copper layer and then performing another electroplating process to form either a nickel layer or a tin layer over the copper layer.

13. A method for treating a surface of a non-metallic article, comprising:
    forming an anti-plating layer over a first area of the surface of the article;
    treating a boundary of the anti-plating layer by laser beam etching whereby the boundary of the anti-plating layer can have a smooth quality;
    treating a second area of the surface of the article surrounding the first area so that the second area is electrically conductive; and
    electrically plating a metal layer to the second area of the non-metallic article in which the boundary of the anti-plating layer forms an interface between the anti-plating layer and the plated metal layer.

14. The method of claim 13, wherein the non-metallic article is a plastic article.

15. The method of claim 13, wherein the laser beam etching is a low energy laser beam etching.

16. The method of claim 13, wherein the step of forming an anti-plating layer over the non-metallic article comprises performing a coating process of anti-plating material to the article.

17. The method of claim 13, wherein the step of forming an anti-plating layer over the non-metallic article comprises performing a printing process of anti-plating material to the article.

* * * * *